BEST AVAILABLE COPY

July 25, 1972 FRANK F. FANG ET AL 3,679,492

PROCESS FOR MAKING MOSFET'S

Filed March 23, 1970 3 Sheets-Sheet 1

INVENTORS
FRANK F. FANG
ALAN B. FOWLER

BY [signature]
ATTORNEY

BEST AVAILABLE COPY

July 25, 1972 FRANK F. FANG ET AL 3,679,492

PROCESS FOR MAKING MOSFET'S

Filed March 23, 1970 3 Sheets-Sheet 2

BEST AVAILABLE COPY

July 25, 1972 FRANK F. FANG ET AL 3,679,492

PROCESS FOR MAKING MOSFET'S

Filed March 23, 1970 3 Sheets-Sheet 3

United States Patent Office 3,679,492 Patented July 25, 1972

3,679,492

PROCESS FOR MAKING MOSFET'S

Frank F. Fang and Alan B. Fowler, Yorktown Heights, N.Y., assignors to International Business Machines Corporation, Armonk, N.Y.

Filed Mar. 23, 1970, Ser. No. 21,562
Int. Cl. H01l 7/54
U.S. Cl. 148—1.5 3 Claims

ABSTRACT OF THE DISCLOSURE

A process for preparing metal-oxide semiconductor devices (MOSFET's) using ion implantation is described wherein aluminum source and drain contacts are added after ion implantation through a highly refractory metal gate so that very high temperature annealing can be used. If the aluminum contacts are put down before the high temperature annealing, not only does a reaction between the aluminum and thin oxide channel region of the MOSFET occur, but ohmic contacts at the source and drain deteriorate, resulting in defective devices.

Figure 1A:
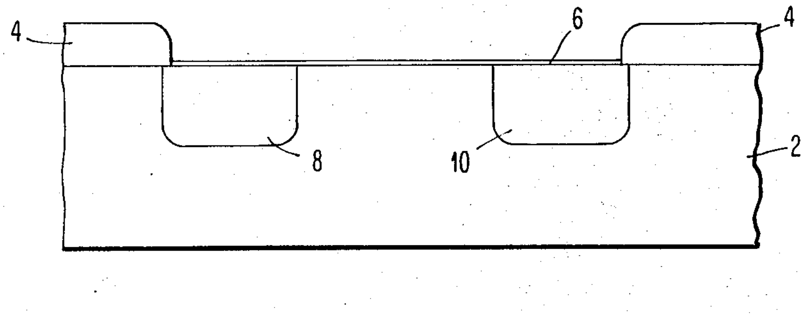
Figure 1B:
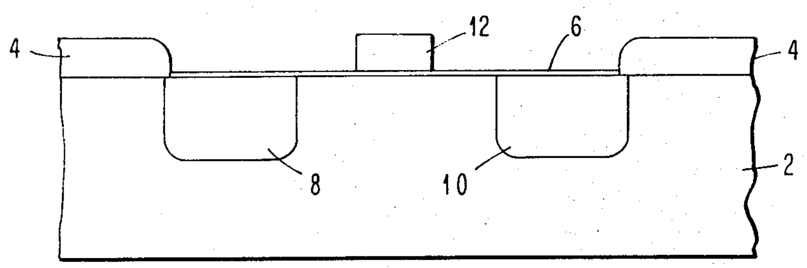

This invention relates to a novel process for making metal-oxide-silicon field effect transistors (MOSFET's) using ion implantation of dopants.

Presently popular methods of making MOSFET's employ aluminum as the contacts for the source and drain regions of the MOSFET, because aluminum makes a good ohmic contact with the semiconductor material, i.e., silicon, in which are located the source and drain regions. Additionally, it is necessary to precisely position the metal gate of the MOSFET device over the space or the preformed channel region between the source and drain electrodes of the device so that the channel region between the source and drain is completely modulated by potentials applied to the gate electrode. If the gate is too wide relative to the channel region, undesirable and excessive stray capacitance is developed which reduces the frequency response of the device. If the gate is too narrow relative to the channel region and does not cover it in its entirety, undesirable ohmic and non-ohmic losses are introduced into the device, resulting in low conductance.

To assure proper positioning of the gate between the source and drain regions of the MOSFET device, one can use the metal gate as a mask and ion implant desired conductivity-type-determining impurities into the device from the same side of the device as the metal gate so that the source and drain regions are established having precise geometry and depth with respect to the gate region. One such procedure for ion implantation is shown and described in the Bower Pat. 3,472,712 which issued Oct. 14, 1969 on a patent application filed on Oct. 27, 1966.

When ion implantation is used, the lattice structure of the silicon is damaged. Under certain conditions, a high temperature (above 600° C.) is necessary to completely restore the lattice structure and electrically activate the implanted ions and allow the device to be usable as a transistor. Such high temperatures are destructive of the aluminum ohmic contacts between the source and drain because of the eutectic formation of an Si and Al system at 577° C. Because of the accelerated interaction of $SiO_2$–Al at high temperature, the gate metal will migrate to Si and destroy the insulator; therefore, the field effect action of the device. Attempts to use higher refractory metals as contacts for the source and drain regions to overcome the deleterious affects of high temperature annealing on aluminum contacts have been unavailing because higher refractory metals make poor ohmic contacts with semiconductor materials.

It is desirous to be able to prepare a MOSFET device, using ion implantation, yet preserve a material such as aluminum as the contact material, despite the step of annealing the device at very high temperatures. In order to achieve the aforementioned, a highly refractory metal, such as molybdenum or tungsten, is employed as the gate of the device, which gate serves as the mask during ion implantation. Ion implantation takes place prior to laying down the aluminum contacts so that annealing of the device can take place at very high temperatures. After the annealing step, a photoresist layer is placed over the device and on top of this layer is deposited a layer of aluminum. Then by using a photographic mask, activating light can be sent through the latter so that a subsequent solvent for the photoresist can remove all the photoresistive materials and all the aluminum extending over the gate region. The last step, when completed, provides a residue of aluminum contacts that are not damaged by any further high temperature annealing step.

Figure 1C:
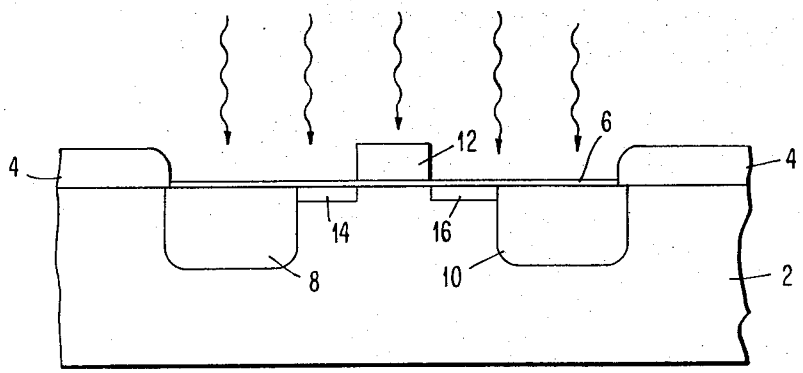
Figure 1D:
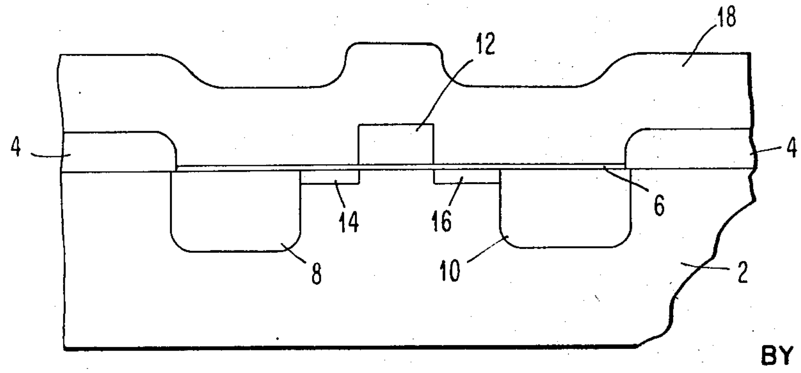
Figure 1E:
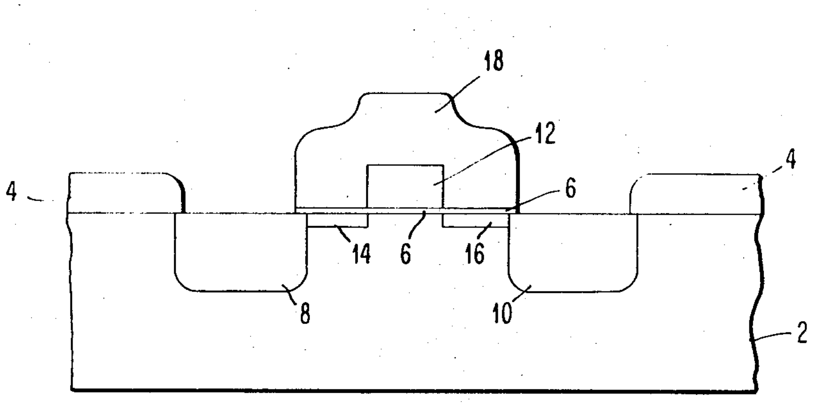
Figure 1F:
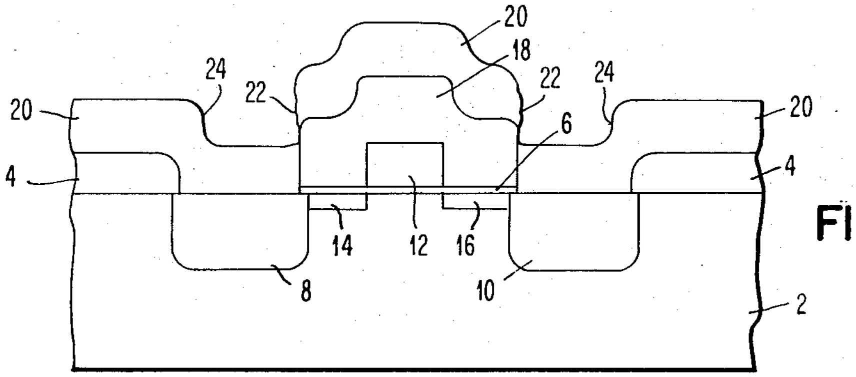
Figure 1G:
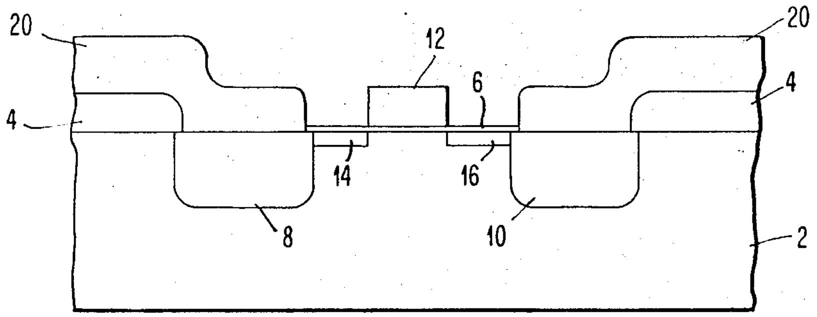
Figure 2A:
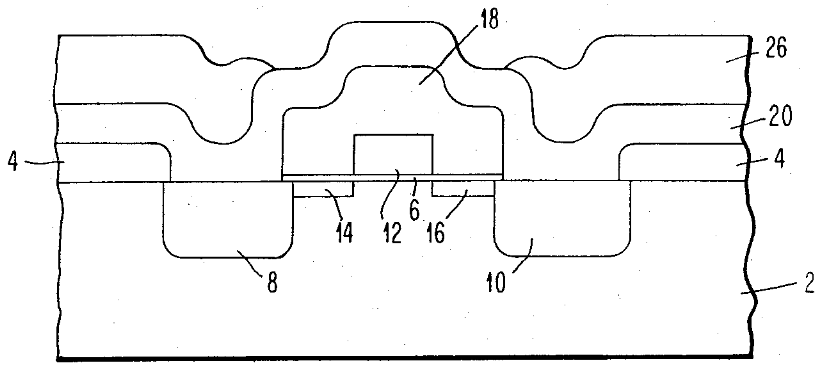
Figure 2B:
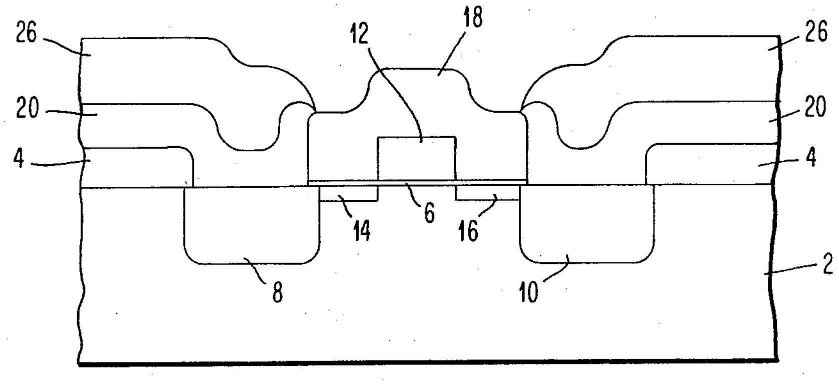

The invention will be better understood with reference to the drawings wherein FIGS. 1*a*–1*e* represent those steps in the prior art, with the exception of refractory metal which is explicitly required in this invention, for making MOSFET devices that are common to this invention and other known processes, but FIGS. 1*f* and 1*g* indicate the sequence of steps employed to produce the improved device. FIGS. 2*a* and 2*b* show sequences that are alternatives for the sequences set out in FIGS. 1*f* and 1*g*.

In FIG. 1*a*, the preliminary step in the making of a MOSFET device consists in starting with a p-type silicon wafer 2 on which is deposited a layer 4 of silicon oxide or silicon nitride, or other suitable insulating material. Layer 4 should be at least as thick as the range of the high energy ion beam to be used for implantation so that only the thinner oxide region 6 (which is smaller than the range of ion beam) is affected by such implantation, the oxide film 4 serving as a mask for those regions outside region 6. Selected regions 8 and 10 of the silicon wafer 2 are doped by any known means, such as thermal diffusion of phosphorus, to make these heavily n type. Regions 8 and 10 ultimately become part of the source and drain of the field-effect device finally produced.

The thin insulating layer 6 of silicon oxide isolates a gate member 12 from the source and drain regions 8 and 10 respectively, such gate member 12 being made by conventional photolithographic techniques. In the present case, gate member 12 is chosen to be of molybdenum because of its ability to be heated to temperatures of 600° C. or higher without affecting the insulating property of thin oxide layer 6 under it. As shown in FIG. 1*c*, ion implantation of phosphorus ions takes place, with the molybdenum gate 12 serving as a mask, so that more precisely located source and drain regions, 14 and 16, respectively, are created exactly at the edge of the gate region. After the ion implantation step is completed, the semiconductor body 2 is heated to desired annealing temperatures which often is in excess of 600° C. so as to repair the damage done to the semiconductor lattice during such ion bombardment and to electrically activate the implanted impurities. By employing molybdenum or tungsten for the gate, instead of aluminum or similarly lower refractory conductive material, high annealing temperatures can be used, such high temperatures assuring better material property of the semiconductor portion that underwent ion implantation than would occur were annealing to take place at low temperatures, e.g., 550° C. or less.

After annealing, a suitable photoresist or chemically removable layer 18 is coated over the partially completed device as seen in FIG. 1*d*. By using a conventional mask to protect the gate region, all portions of the photoresist layer 18 and thin silicon region 6 over the source and drain contact areas, except those portions over the gate region, are removed, leaving the partially completed device as seen in FIG. 1*e*. Since the active part of the finally completed MOSFET device lies between extended source region 14 and extended drain region 16 that was attained by ion implantation using the molybdenum gate 12 as a mask, it is not critical at this point in the manufacturing process if the remanent photoresist 18 extends into regions 8 and 10 on both sides of the gate region. So long as any subsequent deposit of metal electrodes is made onto regions 8 and 10, the benefits achieved by properly spacing extended regions 14 and 16 with respect to gate electrode 12 and thin insulator region 6 are retained.

In the next step shown in FIG. 1*f*, an aluminum coating 20 is deposited over the entire structure. Now when a chemical solvent is employed to remove the portion 18 of the photoresist that was not previously removed, that portion of the aluminum layer 18 directly over the now dissolved remanent photoresist will fall away from the body of aluminum layer 20 and be washed away, leaving the finished structure shown in FIG. 1*g*.

After the aluminum layer 20 has been deposited over the entire surface of the device, because of the nature of the evaporation process, the "step" portions of the aluminum layer 20 (indicated by the numbers 22) adjacent the photoresist material are exceedingly thin and will be a very small fraction of those thicknesses of the aluminum layer 20 that are parallel to oxide layer 6. As a practicality, such step portions will actually be pitted holes. Consequently when a photoresist solvent is applied to the overall device being constructed at the stage shown in FIG. 1*f*, the dissolved photoresist will ooze or drain out of these holes so that the layer of aluminum 20 immediately over the gate region will come away from the remaining portion of the aluminum layer 20, resulting in the finished MOSFET device shown in FIG. 1*g*.

It appears that the aluminum layer 20 also has stepped regions near the vertical walls 24 of the thick oxide layers 4, so one would expect that such regions near walls 24 would render the aluminum so pitted that the aluminum would not serve as good conductors of electricity. However, most MOSFET devices are made so that the relative dimensions of the various components are as follows:

Thin oxide region 6~250–500 A. thick;
Molybdenum gate 12~5000 A. thick and 10,000 A. wide;
Thick oxide region 4~5000 A. thick;
Aluminum layer 20~7000 A. thick;
Photoresist layers 18~10,000 A. thick.

Because the aluminum layer 20 traverses a steeper wall (10,000 A.) of photoresist material than it traverses when it is deposited over oxide region 4 (5000 A.), there is more spillover of aluminum over oxide 4 than there is over the photoresist material, allowing the aluminum deposit to be a continuous one near the vertical walls of oxide regions 4 but a discontinuous one near the vertical walls of the photoresist material. Moreover, even a small defect will allow an etchant to etch away the photoresist 18 and thus remove the aluminum over it. A small defect at the oxide-aluminum step will not destroy the contact of the source and drain.

FIGS. 2*a* and 2*b* depict alternate ways of obtaining the finished product shown in FIG. 1*g*. After the device has reached the state of manufacture shown in FIG. 1*e*, a second layer of photoresist material 26 is coated and photolithographically etched so that the entire top surface of the device is covered with such photoresist materials 26 except that portion of the aluminum 20 that is above the gate region. In FIG. 2*a*, a chemical etchant is then used which attacks the aluminum 20 but not the photoresist layers 18 and 26, causing such narrow layer to be washed away from the remaining portion of the device. FIG. 2*b* shows the device after removal of the aluminum layer 20 that is immediately over the gate regions. A photoresistant solvent is applied to the device to remove all the remaining photoresist materials 18 and 20, leaving the finished MOSFET device as is shown in FIG. 1*g*.

Although all the individual steps discussed hereinabove are old, the novel sequence of steps permits one to manufacture a MOSFET device whereby the distance between source 14 and drain region 16 is very accurately controlled, and very narrow gate regions and exceedingly thin oxide channels (of the order of 250 A. or less) between such regions can be manufactured compatibly with aluminum electrodes. The above noted sequence of steps permits high annealing temperatures, which are needed to achieve the desired property of the implanted region of the silicon crystal 2 that was damaged by ion implantation (a desired procedure for preventing overlapping capacitance between gate and source and drain), without negating the use of aluminum which makes a good ohmic contact with silicon. Obviously, if a highly refractory material such as molybdenum could be used as a good ohmic contact with silicon, then the novel procedure shown and described would not be necessary. However, until the advent of such invention, the art of making a MOSFET device is enhanced by making all portions of the device before the aluminum contacts are deposited so that the benefits of ion implantation and high anneal temperatures are obtained while preserving the advantages of aluminum electrodes.

The sequence of steps shown in FIGS. 1*d*–1*g* provide the novelty over the known prior art. It is highly desirable to make the thin oxide channel 6 lying between the gate region 12 and the source 14 and drain 16 regions very thin, say of the order of 250 A. or less. Presently made devices have channel regions that are over 500 A. thick. Thinner channel regions allow high performance and high packing density integrated circuits. But if such channels are made so thin, the final MOSFET device will be damaged if low refractory gate materials are used with high temperature annealing. The sequence of steps set out in FIGS. 1*d*–1*g* and its alternate steps of FIGS. 2*a* and 2*b* are particularly desirable in that they allow for (1) the use of very thin channel regions 6; (2) self-alignment or good registration of the gate with its associated source and drain regions, (3) very high annealing temperatures for restoration of the lattice structure of a semiconductor bombarded with ions and (4) retention of aluminum or low refractory metal contacts with the source and drain of the MOSFET in that aluminum makes a good ohmic contact with silicon whereas known highly refractory metals do not make good ohmic contacts with silicon.

What is claimed is:

1. In the method of fabricating an insulated-gate field-effect device wherein a layer of insulating material is formed on a surface of a semiconductor body with a region of said insulating material being thin relative to the thickness of other regions thereof, a highly refractory metallic gate electrode member is formed on a portion of said thin region of insulating material, ions of a conductivity-type-determining impurity are impinged on said thin region of insulating material so that they penetrate therethrough and enter into said semiconductor to establish regions therein of opposite conductivity type with respect to the semiconductor body under said gate electrodes, and such partially completed device is subject to very high annealing temperatures to reorder the semiconductor that was damaged by said ion implantation, the improvement in said method comprising the steps of:

covering said partially completed device with a first layer of photoresist material, removing all such photoresist material save that in the immediate vicinity of the gate region and said ion implanted regions, etching away all the thin insulating region except that which is below the remanent photoresist material, depositing a layer of metal over said partially completed device, depositing a second layer of photoresist material over said metal layer so the latter is covered save near the gate region by means of photolithographic technique for subtractive etching, applying a metal etchant to the device to remove only that metal portion which is not covered by the second layer of photoresist material, and applying a solvent to remove all the photoresist material.

2. The method of claim 1 wherein the region of thin insulating material is silicon dioxide.

3. The method of claim 2 wherein the metal layer is aluminum.

References Cited

UNITED STATES PATENTS

| | | | |
|---|---|---|---|
| 3,566,517 | 3/1971 | Brown et al. | 29—571 |
| 3,472,712 | 10/1969 | Bower | 148—187 |
| 3,413,531 | 11/1968 | Leith | 317—235 |

L. DEWAYNE RUTLEDGE, Primary Examiner

J. M. DAVIS, Assistant Examiner

U.S. Cl. X.R.

29—571; 148—187; 317—235 R